(12) United States Patent
Thomas et al.

(10) Patent No.: US 6,610,577 B1
(45) Date of Patent: Aug. 26, 2003

(54) SELF-ALIGNED POLYSILICON POLISH

(75) Inventors: Jack F. Thomas, Palo Alto, CA (US);
Unsoon Kim, Santa Clara, CA (US);
Krishnashree Achuthan, San Ramon, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/150,204

(22) Filed: May 15, 2002

(51) Int. Cl.[7] .................. H01L 21/8247; H01L 21/331
(52) U.S. Cl. .................. 438/311; 438/257; 438/258; 438/259; 438/260; 438/261; 438/264; 438/267; 438/296; 438/318
(58) Field of Search ..................... 438/257, 258, 438/259, 260, 261, 264, 267, 296, 311, 593, 692, 318

(56) References Cited

U.S. PATENT DOCUMENTS 6,013,551 A * 1/2000 Chen et al. .................. 438/264

* cited by examiner

Primary Examiner—Hoai Ho
Assistant Examiner—Reneé R. Berry
(74) Attorney, Agent, or Firm—Winstead Sechrest & Minick P.C.; Robert A. Voigt, Jr.

(57) ABSTRACT

A method for removing polysilicon from isolation regions on a substrate during semiconductor fabrication is disclosed. The method includes depositing a layer of polysilicon over the substrate, and depositing at least one dielectric layer over the polysilicon. The method further includes polishing the polysilicon from the isolation regions, wherein the dielectric layers act as a polishing stop, resulting in regions of polysilicon that are self-aligned to the trench isolation regions.

13 Claims, 4 Drawing Sheets

SELF-ALIGNED POLYSILICON POLISH

FIELD OF THE INVENTION

The present invention relates to semiconductor processing, and more particularly to a method for removing polysilicon from isolation regions when forming floating gates in a memory core by polishing the polysilicon such that the remaining polysilicon is self-aligned to trench isolation structures,

BACKGROUND OF THE INVENTION

Flash memory chips are conveniently packaged as "flash cards," using PC Card, CompactFlash, Smart Media and similar formats. Flash memory has become widely used as film in digital cameras as well as auxiliary storage in a variety of handheld commercial and consumer devices. As illustrated in FIG. 1, a conventional flash memory 10 typically includes one or more a high-density core areas 12 and a low density periphery area 14 on a single substrate 16. The core area includes at least one NxM array of memory transistors for storing data, while the periphery area 16 of the flash memory 10 includes switching logic.

The memory transistors in the core 12 each have a substantially similar stacked gate structure, where the stacked gate structure includes a floating gate comprising a type-1 layer of polysilicon (poly 1) underneath a control gate, which comprises a type-2 layer of polysilicon (poly 2). The layer of poly 2 also forms word lines and select lines in the flash memory array. The transistors in the periphery area 16 have only one gate comprising a layer of poly 2. Thus, these transistors are referred to as poly 2 transistors.

The major processing steps for fabricating a flash memory array begin by patterning a nitride mask to define alternating columns of active device regions and isolations regions on a substrate. For sub-micron devices, shallow trench isolation is used to form shallow trenches in the substrate in between the active regions to create isolation regions in both the periphery and core areas 12. After the shallow trenches are formed, a layer of liner oxide is grown in the trenches, followed by a deposition of an isolation dielectric, such as oxide to fill the trenches. After the trench oxide is deposited, the trench oxide is polished back using a chemical mechanical polish (CMP) so that the oxide remains only in the trenches, its top surface slightly recessed with the previously etched nitride mask. After the trench oxide is polished, the nitride mask is stripped, and a layer of polysilicon is deposited in both the core 12 and periphery 14. In the memory core 12, floating gates will be patterned and etched in the conventional processing approach with some positional variability due to lithographic positional overlay error. Eventually, the polysilicon in the periphery 14 will be removed, followed by the deposition of poly 2 to form both the stacked gate structures in the core 12, and the poly 2 transistors in the periphery 14.

FIG. 2 is a perspective view (not to scale and not including core gate dielectrics or interpoly layer dielectrics) of a portion of the memory array in the core region 12 at a stage in fabrication prior to poly 2 deposition. In order to form the floating gates, the layer of the polysilicon 18 must be etched away from the trench isolation regions 20, leaving the polysilicon 18 only in the active regions, as shown.

Previous techniques for etching the polysilicon 18 include depositing a layer photoresist over the layer of polysilicon 18, and patterning the photoresist using lithographic techniques to form a mask. Using the mask, the polysilicon 18 is etched to form parallel lines of polysilicon 18 that will be used to form floating gates. Thereafter, the photoresist mask is removed.

Although this technique is effective for etching the polysilicon 18, the mask and etch technique inherently results in alignment errors due to lithographic limitations. Therefore, when the design rules for tolerances are specified, transistor spacing on the substrate must be sacrificed to ensure that the columns of polysilicon 18 overlap the isolation regions. Otherwise, if a mask alignment error were to occur, too much of the polysilicon 18 may be etched away from the isolation regions 20, leaving portions of the substrate 16 exposed, which results in faulty semiconductor devices.

An improved mask and etch technique has recently been developed for patterning materials during semiconductor fabrication that is capable of surpassing lithographic limitations in which a hard mask is substituted for the photoresist mask. Although the hard mask approach allows the spaces between the polysilicon 18 to be closer together, the hard mask approach is complex and adds to the number of processing steps.

Accordingly, what is needed is an improved method for removing the polysilicon from the isolation regions without the complexities of a hard mask. The present invention addresses such a need.

SUMMARY OF THE INVENTION

The present invention provides a method for removing polysilicon from isolation regions on a substrate during semiconductor fabrication. The method includes depositing a layer of polysilicon over the substrate, and depositing at least one dielectric layer over the polysilicon. The method further includes removing the dielectric from the memory core and polishing the polysilicon from memory core isolation regions between memory cells, while the dielectric layers act as a polishing stop in periphery areas. This results in regions of floating gate polisilicon that are self-aligned to the trench isolation regions.

According to the method disclosed herein, by depositing dielectric layers over the polysilicon, lines of polysilicon that are self-aligned to trench isolation structures are provided in the memory core, while non-uniform polysilicon polish in the periphery is prevented. Defining self-aligned polysilicon floating gate structures increases memory core transistor density, and improves polysilicon capacitive coupling uniformity to the substrate, valuable in programming and erasing the cells in circuit operation.

DETAILED DESCRIPTION

The present invention relates to a poly polish method that results in lines of poly that are self-aligned with isolation regions. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

The present invention provides a method for polishing polysilicon during fabrication of a flash memory that has one more high-density core areas and a low-density periphery area. The method allows the use of chemical mechanical polish of poly 1 lines in the core areas to create polysilicon structures that are self-aligned with isolation regions, while preventing destructive non-uniform excess polish in areas not needing polysilicon self-alignment.

Figure 1:
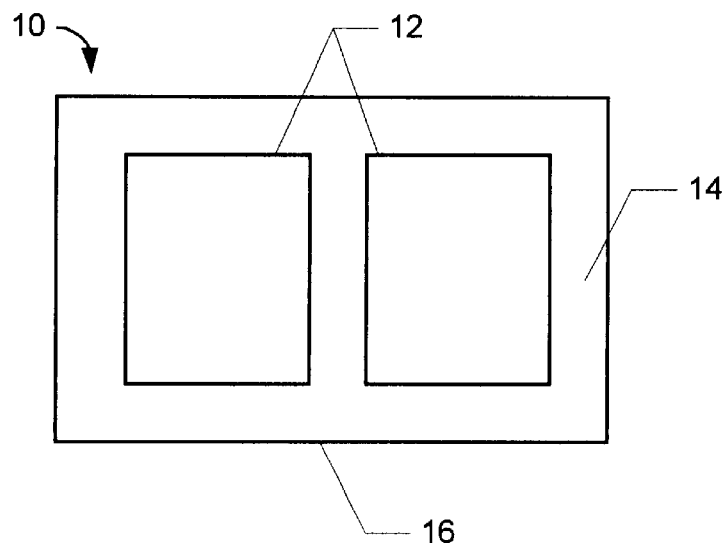
FIG. 1 is a diagram illustrating a conventional flash memory.
Figure 2:
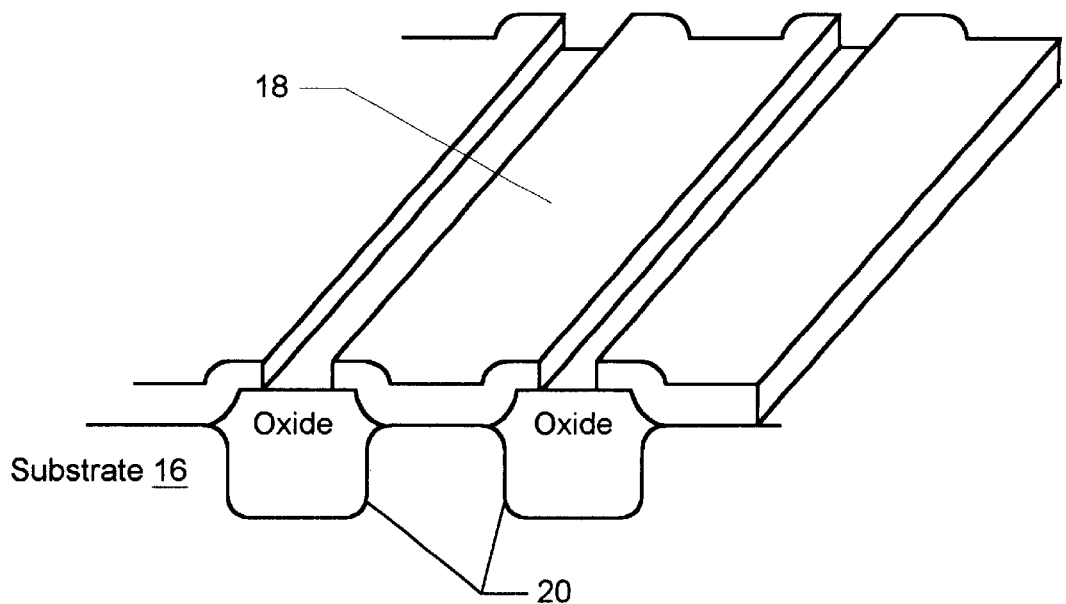
FIG. 2 is a perspective view (not to scale) of a portion of the memory array in core region at a stage in fabrication prior to poly 2 deposition.
Figure 3:
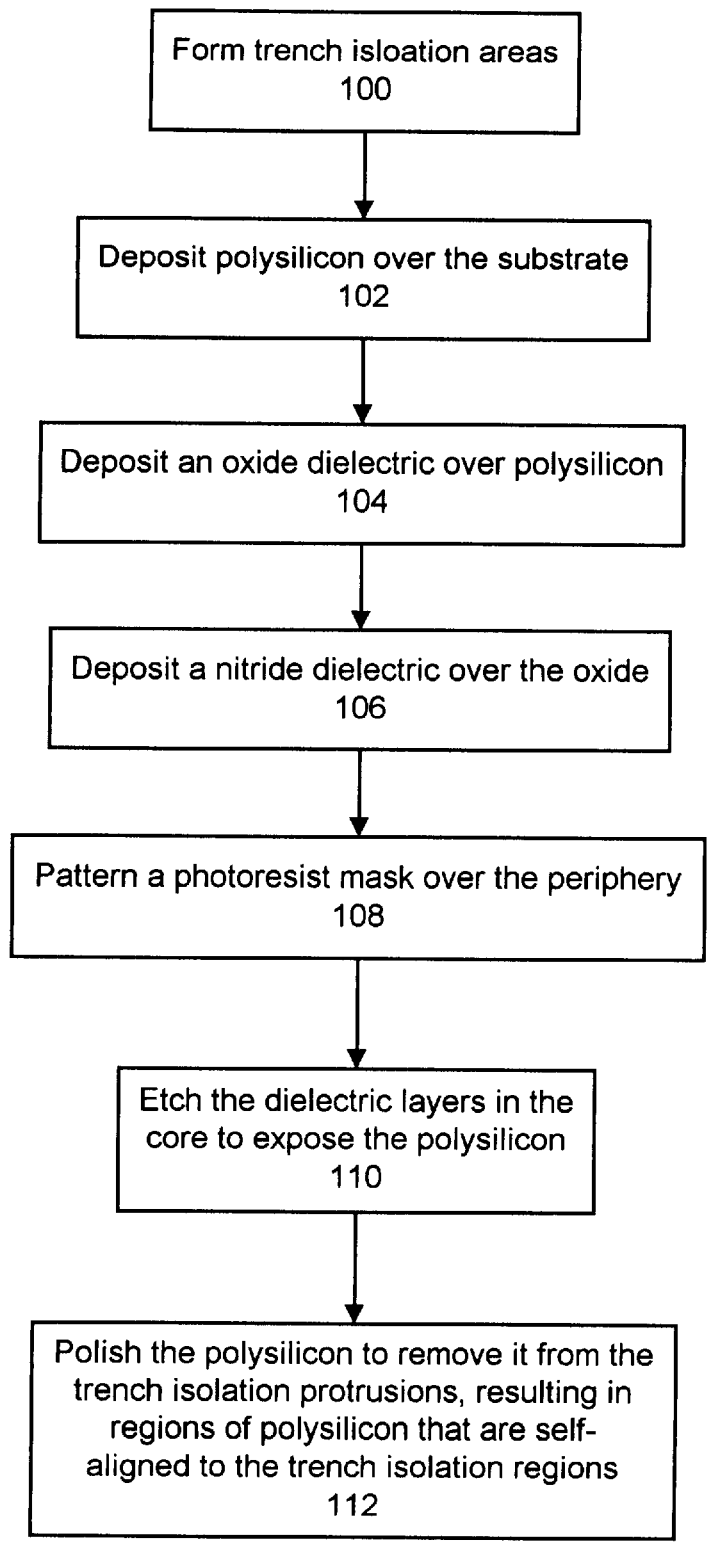
FIG. 3 is a flow chart illustrating the fabrication steps used to pattern polysilicon into floating gates in accordance with a preferred embodiment of the present invention.

FIG. 3 is a flow chart illustrating the fabrication steps used to pattern polysilicon into floating gates in accordance with a preferred embodiment of the present invention. FIGS. 4A–4F are cross-sectional views of the memory during the fabrication steps described in FIG. 3.

Figure 4A:
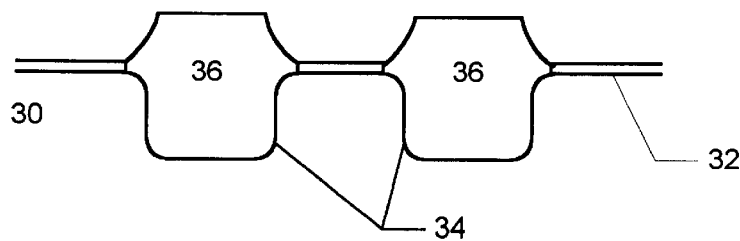
FIGS. 4A–4F are cross-sectional views of the memory during the fabrication steps described in FIG. 3.

The process begins during semiconductor manufacturing in step 100 after formation of trench isolation regions 34 in a substrate 30, which are formed in-between active areas where transistors will be located (FIG. 4A). A high-quality tunnel oxide ($SiO_2$) 32 has also been grown on the substrate 30. The trench isolation regions 34 have been oxidized (not shown) and filled with an isolation dielectric 36 that forms protrusions above the substrate 30 when chemically mechanically polished to align with a nitride mask ($Si_3N_4$) (not shown) that was defined in a conventional matter. In a preferred embodiment, the isolation dielectric 36 is an oxide such as $SiO_2$, although other materials such as $Si_3N_4$ are also suitable. In a preferred embodiment, the height of the protrusions in the isolation regions 34 are defined largely by the thickness of the nitride mask used in patterning the isolation regions. Tuning the height considers in part what final poly 1 thickness is needed. The height may typically be 800 Angstroms or more above the substrate.

Figure 4B:
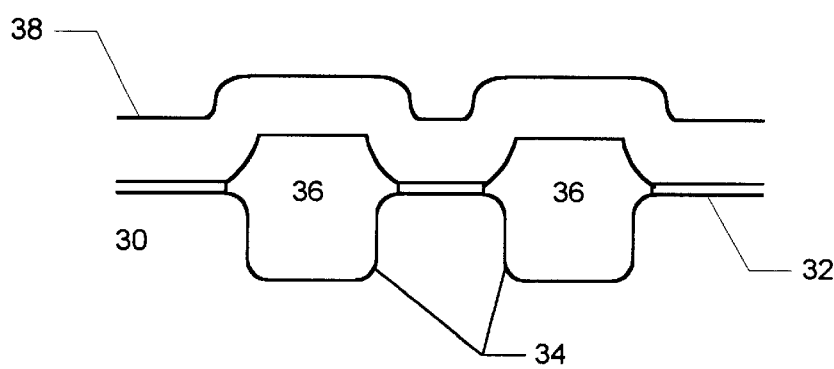

After the trench isolation regions 34 have been formed, a layer of the polysilicon 38 is deposited over the substrate 30 in step 102 (FIG. 4B). As stated above, traditional mask and etch techniques become less attractive in shrinking memory core dimensions in part from the lithographic alignment variabilities that restrict the allowable cell size reduction when attempting to create floating gates out of the polysilicon 38 by removing the polysilicon 38 from the isolation regions 34. Rather than etching the polysilicon 38, another alternative is to polish the polysilicon 38 using a chemical mechanical polish (CMP) such that the polysilicon 38 is removed from the tops of the isolation region protrusions.

Polishing the polysilicon 38 directly has disadvantages, however. One disadvantage is that the polysilicon 38 polishes relatively quickly and suffers from loading effects as different polishing rates will be experienced on different parts of the substrate 30, depending on the polysilicon and oxide densities in different regions of the wafer. Therefore, the polysilicon 38 on one part of the substrate 30 may polish faster than in other parts. As a result, the layer of polysilicon 38 will be over polished in some areas and under polished in others, in which case portions of the polysilicon 38 may remain over the trench isolation regions 34 after polishing.

The present invention is a method for polishing the layer of polysilicon 38 in which two layers of dielectrics are deposited over the polysilicon 38 in steps 104 and 106 to prevent the polysilicon 38 polishing process in the non-memory core areas of the wafer and along adequate poly thickness control in the memory core 12. The process results in lines of polysilicon 38 that are self-aligned with respect to the trench isolation regions.

Figure 4C:
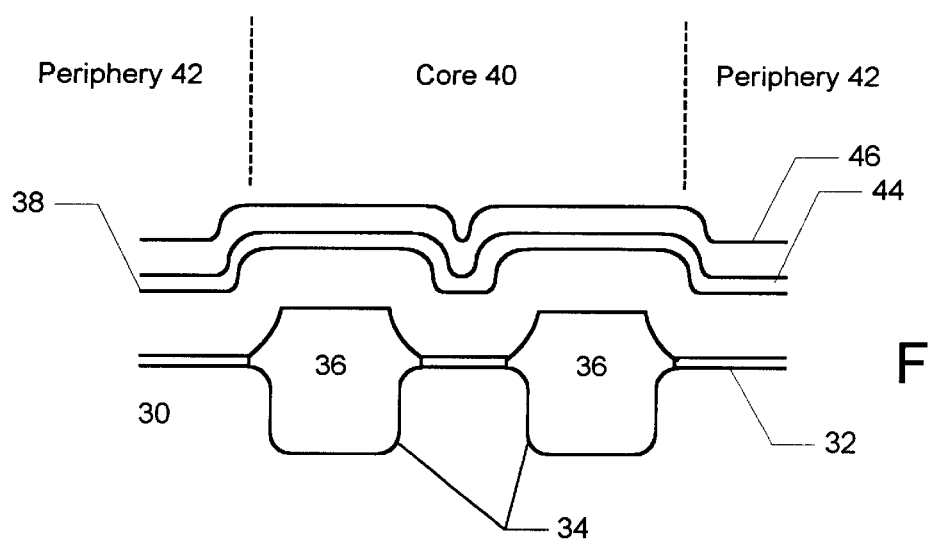

In operation, a layer of oxide 44 is deposited in step 104 over the layer of polysilicon 38 in both the core 40 and periphery 42 (FIG. 4C) to provide some protection against injuring the floating gate polysilicon devices when removing a polish-protect nitride layer 46, which is deposited over the oxide 44 in step 106 (FIG. 4C). In a preferred embodiment, the oxide layer 44 comprises $SiO_2$, which is deposited at a thickness of approximately 100 angstroms, and the nitride layer 46 comprises $Si_3N_4$, which is deposited at a thickness of approximately 200–1000 angstroms. Because the dielectrics 44 and 46 are harder to polish than the polysilicon 38, the dielectrics 44 and 46 act as a polish stop so that the polysilicon 38 is not polished off in regions where this dielectric will remain. The dielectrics 44 and 46 enable the polishing to be stopped, or at least slowed down significantly, when the trench isolation regions 34 are reached.

Figure 4D:
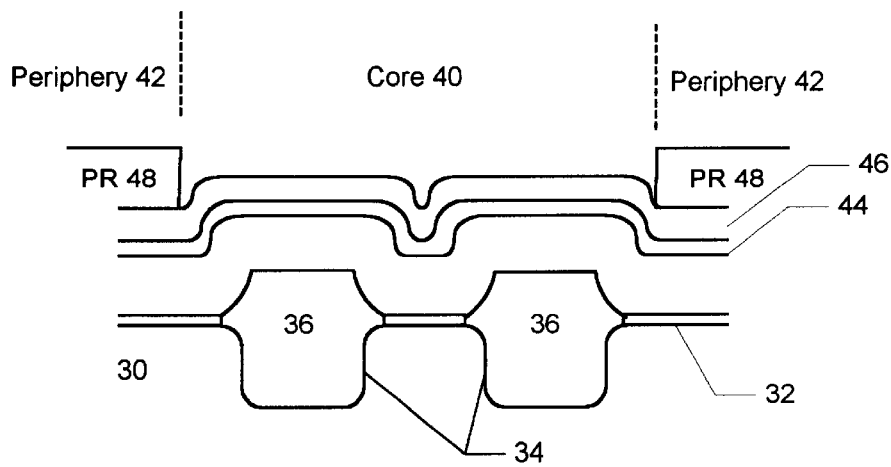
Figure 4E:
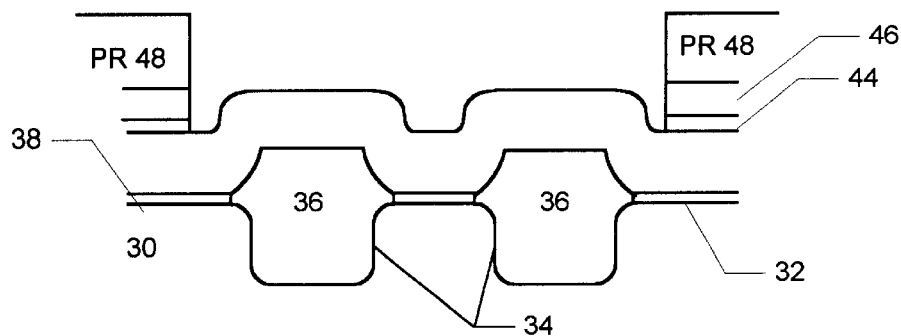

After the protecting dielectric layers 44 and 46 are deposited, a photoresist mask 48 is patterned over the periphery 42 in step 108 (FIG. 4D). Thereafter, the dielectric layers 44 and 46 are dry etched (or the nitride is dry etched and the oxide wet etched to better protect the polysilicon from dry etch damage that may degrade data retention) in the core 40 to expose the polysilicon 38 in step 110. In this step, the dielectric layers 44 and 46 are mostly removed above the polysilicon 38 and in the recesses between the isolation regions 34 in the core 40 (FIG. 4E). The purpose of this dry etch is to prevent the dielectric layers 44 and 46 from protecting the polysilicon 38 over the core isolation regions 34 during the poly polish, while blocking the polishing in the periphery 42.

Figure 4F:
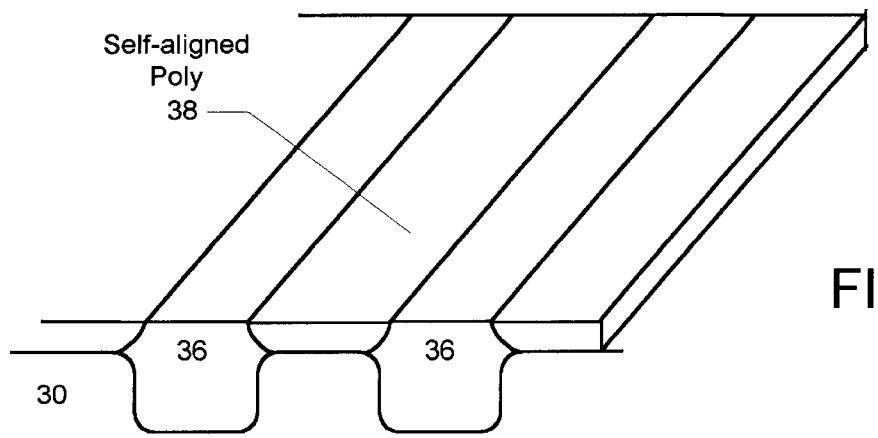

After the dry (or combination dry and wet etch) etch, the photoresist 48 is removed over the periphery, and a chemical mechanical polish (CMP) is used to remove the polysilicon from above the trench isolation protrusions in step 112, resulting in regions of polysilicon 38 that are self-aligned to the trench isolation regions 34 (FIG. 4F). As stated above, the polishing is stopped when the trench fill dielectric 36 is encountered.

According to the present invention, the polishing process sequence provides self-aligned polysilicon in the memory core 40, while preventing non-uniform polysilicon polish in the periphery 42. The undesired films in periphery 42, the polysilicon 38, and the dielectrics 44 and 46 will be removed prior to periphery gate oxidation and Poly 2 depositions.

A method for forming floating gates in a memory core using lines of polysilicon that are self-aligned to trench isolation structures has been disclosed. The self-aligned lines of polysilicon increase transistor density, and improve polysilicon capacitive coupling uniformity to the substrate. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A method for removing polysilicon from isolation regions on a substrate during semiconductor fabrication, the method comprising the steps of:

(a) depositing a layer of polysilicon over the substrate, (b) depositing at least one dielectric layer over the polysilicon to act as a polishing stop; and (c) polishing the polysilicon from the isolation regions, resulting in regions of polysilicon that are self-aligned to the trench isolation regions.

2. The method of claim 1 wherein step (b) further includes a step of: depositing two dielectric layers over the polysilicon.

3. The method of claim 2 wherein step (b) further includes a step of: depositing a layer of $SiO_2$ at a thickness of approximately 100 angstroms, followed by a layer of $Si_3N_4$ at a thickness of approximately 200–1000 angstroms.

4. The method of claim 1 further including the step of: providing trenches filled with an isolation dielectric as the isolation regions, wherein the isolation dielectric forms protrusions rising above the substrate.

5. The method of claim 4 wherein step (c) further includes a step of: polishing the polysilicon using a chemical mechanical polish (CMP) such that the polysilicon is removed from tops of the protrusions in the isolation regions in areas where the polysilicon is not protected by a polish-stop dielectric layer.

6. The method of claim 1 wherein the substrate includes a core area and a periphery area, and the polysilicon covers both the core and the periphery areas, step (b) further including the steps of:

depositing the dielectric layer over both core and the periphery areas;

patterning photoresist over the periphery area; and etching the dielectric layer in the core area, such that the dielectric layer is mostly removed over the polysilicon in the core area.

7. A method for providing regions of self-aligned polysilicon in a memory device having a core area and a periphery area, wherein the core area has active device regions separated by trench isolation regions that protrude from a substrate, the method comprising the steps of:

(a) depositing a layer of polysilicon over the core and periphery areas;

(b) depositing a first dielectric layer over the polysilicon;

(c) depositing a second dielectric layer over the first dielectric layer;

(d) depositing photoresist over the periphery;

(e) etching the first and second dielectric layers to approximately top of the polysilicon in the core area; and (f) polishing the polysilicon to approximately just below a top of the trench isolation protrusions, wherein the polysilicon remaining over the active areas is self-aligned with respect to the trench isolation regions in the core area.

8. The method of claim 7 further including the step of: forming the trench isolation protrusions at least 800 angstroms above the substrate.

9. The method of claim 8 wherein step (b) further includes the step of: providing an oxide as the first dielectric layer.

10. The method of claim 9 wherein step (b) further includes the step of: providing $SiO_2$ at a thickness of approximately 100 angstroms as the first dielectric layer.

11. The method of claim 9 wherein step (c) further includes the step of: providing nitride as the second dielectric layer.

12. The method of claim 9 wherein step (c) further includes the step of: providing $Si_3N_4$ at a thickness of approximately 200–1000 angstroms as the second dielectric layer.

13. The method of claim 7 further including the step of:

g) removing the first and second layers of dielectrics, the photoresist, and the polysilicon from periphery prior to gate oxidation and poly 2 depositions.

* * * * *

UNITED STATES PATENT AND TRADEMARK OFFICE
CERTIFICATE OF CORRECTION

PATENT NO.    : 6,610,577 B1
DATED         : August 26, 2003
INVENTOR(S)   : Jack F. Thomas, Unsoon Kim and Krishnashree Achuthan It is certified that error appears in the above-identified patent and that said Letters Patent is hereby corrected as shown below:

<u>Column 1,</u>
Line 8, following "structures" please replace "," with -- . --.

Signed and Sealed this

Ninth Day of December, 2003

JAMES E. ROGAN
*Director of the United States Patent and Trademark Office*